United States Patent
Schulz

[11] Patent Number: 5,883,759
[45] Date of Patent: Mar. 16, 1999

[54] FLEX CIRCUIT HEAD INTERCONNECT FOR IMPROVED ELECTRICAL PERFORMANCE AND EASE OF ASSEMBLY

[75] Inventor: Kevin J. Schulz, Apple Valley, Minn.

[73] Assignee: Seagate Technology, Inc., Scotts Valley, Calif.

[21] Appl. No.: 82,836

[22] Filed: May 21, 1998

Related U.S. Application Data

[62] Division of Ser. No. 607,900, Feb. 22, 1996.

[51] Int. Cl.⁶ ....................................................... G11B 5/48
[52] U.S. Cl. ............................................................. 360/104
[58] Field of Search ..................................... 360/104–106

[56] References Cited

U.S. PATENT DOCUMENTS

| | | | |
|---|---|---|---|
| 3,704,656 | 12/1972 | Ogiso et al. | 327/423 |
| 4,645,280 | 2/1987 | Gordon et al. | 339/17 F |
| 4,760,478 | 7/1988 | Pal et al. | 360/104 |
| 4,761,699 | 8/1988 | Ainslie et al. | 360/103 |
| 4,789,914 | 12/1988 | Ainslie et al. | 360/103 |
| 4,996,623 | 2/1991 | Erpelding et al. | 360/104 |
| 5,012,368 | 4/1991 | Bosier et al. | 360/104 |
| 5,103,359 | 4/1992 | Marazzo | 360/104 |
| 5,121,273 | 6/1992 | Slezak | 360/104 |
| 5,305,168 | 4/1994 | Lin et al. | 360/104 |
| 5,384,432 | 1/1995 | Noro et al. | 360/104 |
| 5,392,179 | 2/1995 | Sendoda | 360/104 |
| 5,404,636 | 4/1995 | Stefansky et al. | 29/603 |
| 5,422,764 | 6/1995 | McIllvanie | 360/97.01 |
| 5,491,597 | 2/1996 | Bennin et al. | 360/104 |
| 5,539,596 | 7/1996 | Fontana et al. | 360/104 |
| 5,608,591 | 3/1997 | Klassen | 360/104 |
| 5,761,005 | 6/1998 | McKay et al. | 360/104 |

FOREIGN PATENT DOCUMENTS

| | | |
|---|---|---|
| 0 617 411 A2 | 9/1994 | European Pat. Off. . |
| 6-84151 | 3/1994 | Japan . |
| WO 93/15593 | 8/1993 | WIPO . |

*Primary Examiner*—Allen T. Cao
*Attorney, Agent, or Firm*—Kinney & Lange, P.A.

[57] ABSTRACT

An electrical interconnect for electrically connecting a magnetic head and read/write circuitry in a disc drive includes a dielectric substrate, a first conductive trace layer deposited upon the substrate, a dielectric layer deposited upon at least a portion of the first conductive trace layer and a second conductive trace layer deposited upon the dielectric layer. The first and second conductive trace layers have ends configured for being electrically coupled to the magnetic head and the read/write circuitry. The first and second conductive trace layers at least partially overlap one another and are sufficiently proximate to one another to reduce inductance of the interconnect.

8 Claims, 5 Drawing Sheets

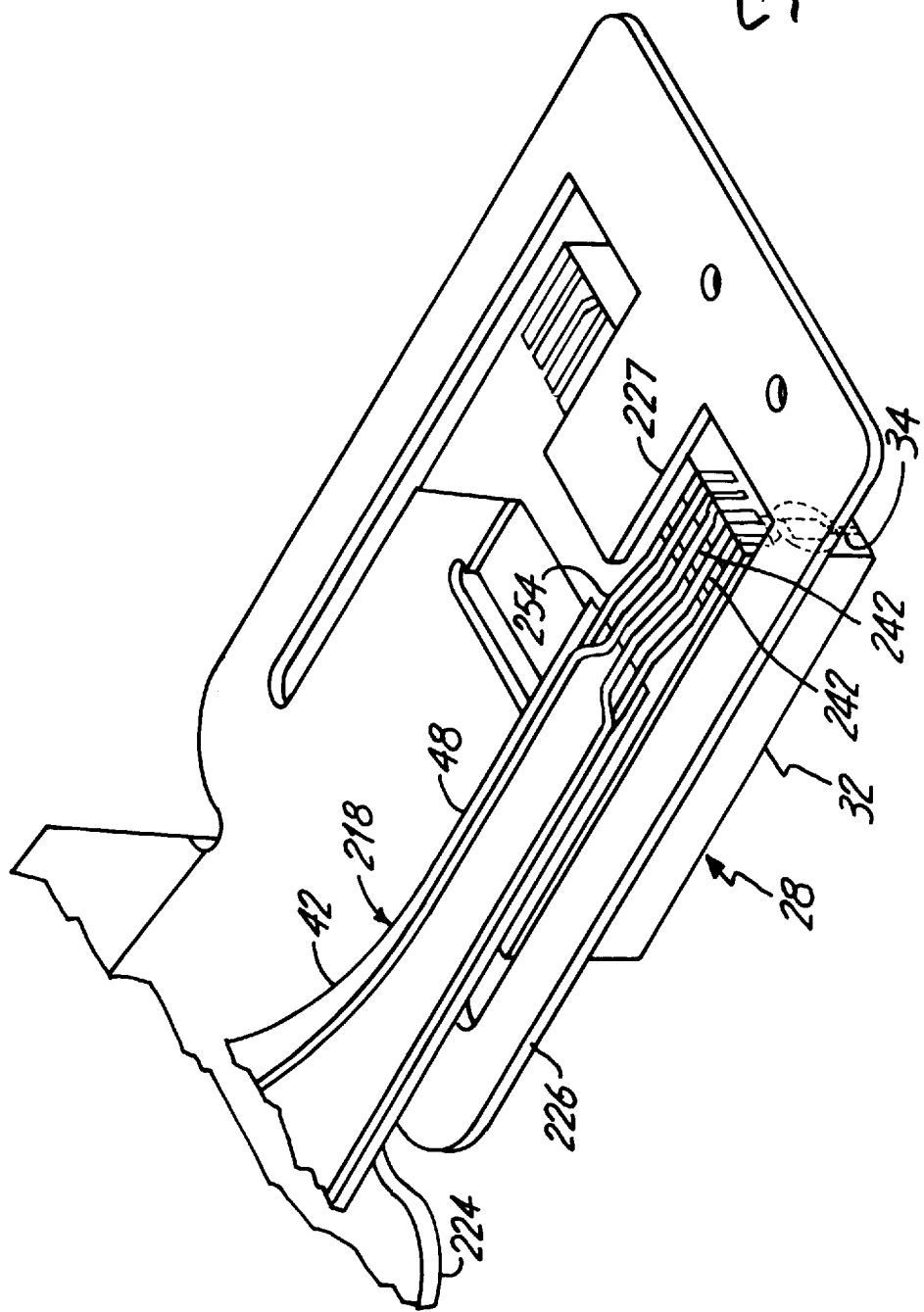

FLEX CIRCUIT HEAD INTERCONNECT FOR IMPROVED ELECTRICAL PERFORMANCE AND EASE OF ASSEMBLY

CROSS-REFERENCE TO RELATED APPLICATION

This application is a Division of application Ser. No. 08/607,900 filed Feb. 22, 1996 pending.

BACKGROUND OF THE INVENTION

The present invention relates to computer disc drives. In particular, the present invention relates to an electrical interconnect for electrically connecting a magnetic head and read/write circuitry in a disc drive.

Magnetic read/write heads require an electrical interconnect between read/write transducers of the magnetic head and read/write circuitry including amplifier components. Electrical interconnects conventionally comprise discrete twisted wire assemblies which are electrically connected to the magnetic head and the read/write circuitry. Although inexpensive, twisted wire electrical interconnects require labor intensive assembly operations for bonding the wires to the heads, routing, crimping and tacking the wire interconnects down the suspension and actuator arms and soldering the wires to read/write circuitry on a circuit board. These labor intensive assembly operations are costly and are prone to error.

In addition, conventional electrical interconnects lack the electrical performance typically required by the increasing data transfer rates of modem magnetic read/write heads. To maximize performance of the read/write circuitry, it is desirable that the electrical interconnect have a low inductance.

SUMMARY OF THE INVENTION

The present invention is an improved electrical interconnect for electrically connecting a magnetic head and read/write circuitry in a disc drive. The interconnect includes a dielectrical substrate, a first conductive trace layer deposited upon the substrate, a dielectric layer deposited upon at least a portion of the first conductive trace layer and a second conductive trace layer deposited upon the dielectric layer so as to at least partally overlap the first conductive trace layer. The first and second conductive trace layers are sufficiently proximate to one another to reduce inductance of the interconnect.

BRIEF DESCRIPTION OF THE DRAWINGS

FIG. 5 is an enlarged fragmentary perspective view of an alternate embodiment of the suspension and electrical interconnect of FIG. 3.

DETAILED DESCRIPTION OF THE PREFERRED EMBODIMENTS

Figure 1:
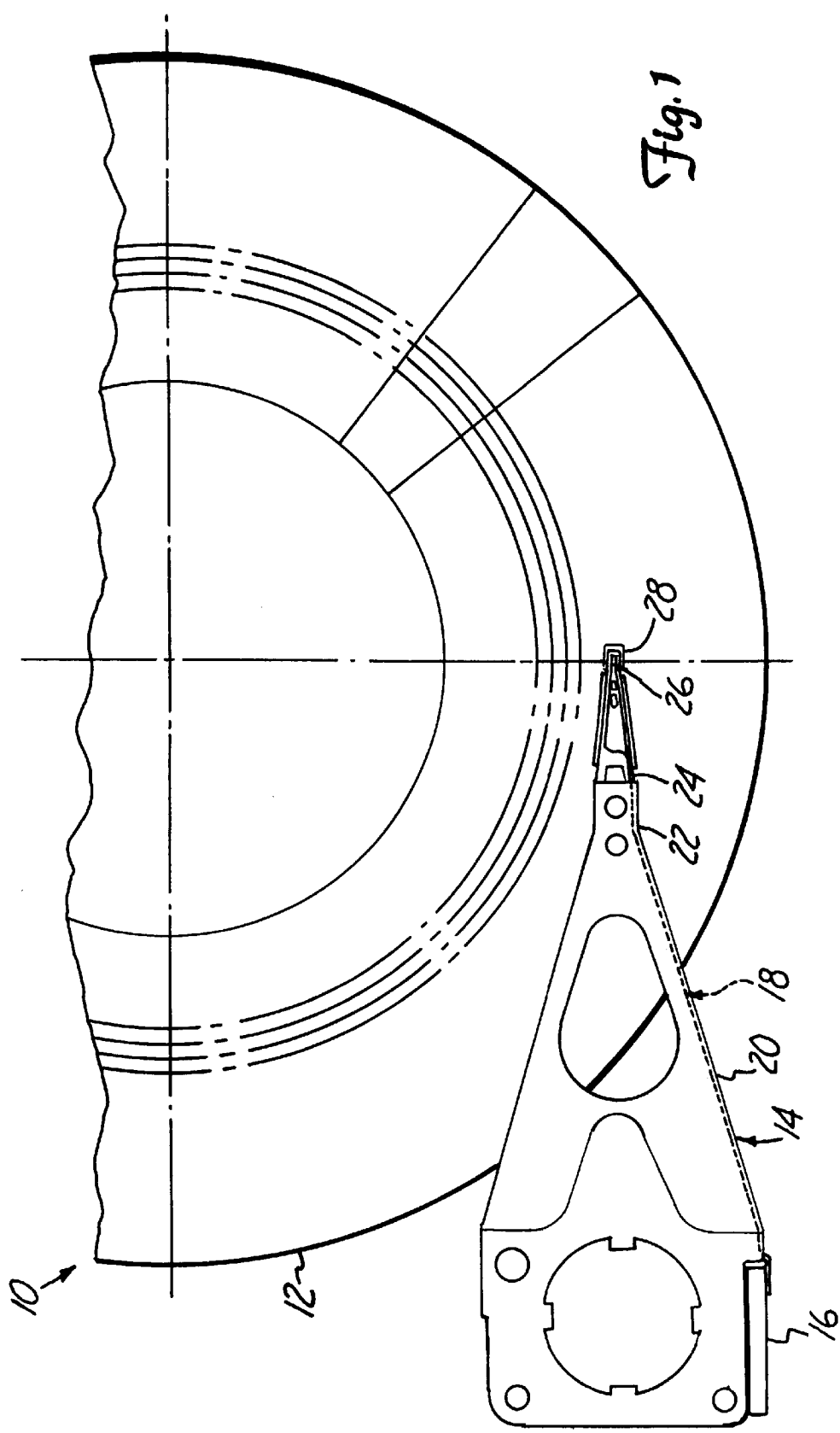
FIG. 1 is a diagrammatic view of a disc drive magnetic head assembly of the present invention.

FIG. 1 is a diagrammatic view of a disc drive magnetic head assembly 10 generally including memory storage disc 12, arm assembly 14, control circuitry 16 and electrical interconnect 18. As is conventionally known, memory storage disc 12 contains magnetically encoded information and is rotated by a spindle motor (not shown).

Arm assembly 14 is supported above memory storage disc 12 by an actuator assembly (not shown) and generally includes actuator arm 20, support arm 22, suspension 24 and head 28. Actuator arm 20 extends from an actuator (not shown) and attaches to support arm 22. Support arm 22 extends from actuator arm 20 and is attached to suspension 24.

Suspension 24 preferably comprises an integrated load beam/gimbal suspension including a gimbal portion 26. Alternatively, suspension 24 may include a distinct load beam and a distinct gimbal which are secured to one another, preferably by laser welding. Suspension 24 is preferably attached to head 28 by an adhesive such as glue or fluid epoxy. Alternatively, suspension 24 may be mounted to head 28 by other conventional mounting methods. Suspension 24 resiliently supports head 28 in the vertical direction to allow head 28 to follow the topography of disc 12. Suspension 24 also supplies a downward force to counteract the hydrodynamic lifting force developed as disc 12 moves beneath head 28. Suspension 24 is preferably formed from a material which enables suspension 24 to be flexible in the vertical direction and rigid in in-plane directions for precise head positioning. The gimbal portion 26 of suspension 24 is resiliently flexible in pitch and roll directions of head 28. At the same time, the gimbal portion 26 is preferably rigid in the yaw and in-plane directions for maintaining precise head positioning.

Figure 2:
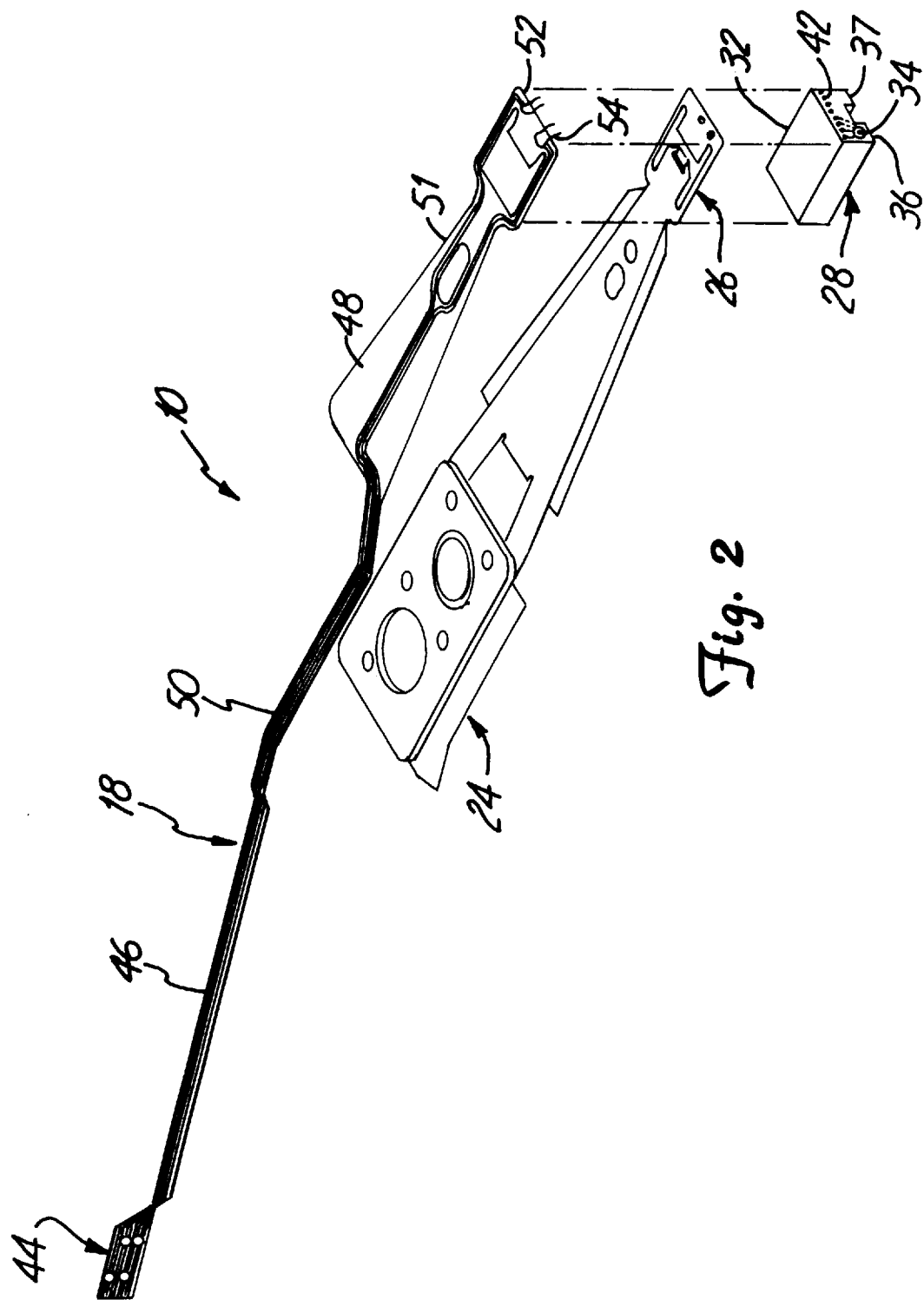
FIG. 2 is an enlarged exploded perspective view illustrating a suspension, magnetic head and electrical interconnect of disc drive magnetic head assembly.

Head 28 preferably comprises an air-bearing slider 32 supporting at least one magnetic transducer 34 (shown in FIG. 2). Head 28 stores and retrieves information stored on memory storage disc 12. Head 28 is electrically connected to control circuitry 16 via electrical interconnect 18 which extends between the magnetic transducer of head 28 and control circuitry 16.

Control circuitry 16 preferably comprises a conventional circuit board mounted adjacent to the actuator (not shown). As is conventionally known, control circuitry 16 typically includes a preamp unit. Control circuitry 16 receives electrical signals from head 28 through electrical interconnect 18 to recover information from memory storage disc 12. In addition, if head 28 is equipped with write transducers, control circuitry 16 also transmits electrical signals representing data through electrical interconnect 18 to magnetic head 28 to magnetically encode information upon magnetic storage disc 12.

Electrical interconnect 18 comprises electrical conductors which extend from magnetic transducer 34 to control circuitry 16. Electrical interconnect 18 electrically transmits electrical signals between magnetic transducer 34 and control circuitry 16. Due to increase in data transfer rates, electrical performance of interconnect 18 has become increasingly important. Electrical interconnect 18 of the present invention provides reliable and economical electrical connection between transducer 34 and control circuitry 16. Moreover, electrical interconnect 18 of the present invention has an extremely low inductance level to improve performance of read/write circuitry in control circuitry 16.

FIG. 2 is an enlarged exploded view illustrating suspension 24, head 28 and electrical interconnect 18 in greater detail. As best shown by FIG. 2, head 28 generally includes an air bearing slider 32, at least one magnetic transducer 34 and contact pads 42. Slider 32 is conventionally known and preferably includes a pair of self-acting hydrodynamic air bearing rails 36, 37. When disc 12 rotates, disc 12 draws air between air bearing rails 36, 37 and the surface of disc 12 to pressurize air bearing rails 36, 37 and to lift slider 32. As a result, slider 32 slides above disc 12.

Magnetic transducer 34 is also conventionally known. Magnetic transducer 34 senses magnetically encoded information upon the surface of memory storage disc 12 and transmits signals corresponding to the stored information to read/write circuitry 16 by means of electrical interconnect 18. Magnetic transducer 34 may also write or magnetically encode information upon the surface of memory storage disc 12. Magnetic transducer 34 may comprise any one of a variety of magnetic transducers such as inductive read/write transducers, magnetoresistive transducers or metal-in-gap transducers.

Contact pads 42 comprise electrical conductors formed from an electrically conductive material, such as copper. Contact pads 42 are preferably fabricated upon a surface of slider 32 as part of a wafer forming several sliders. Contact pads 42 are electrically connected to magnetic transducer 34 and provide a large surface area to which electrical interconnect 18 may be electrically connected.

As further shown by FIG. 2, electrical interconnect 18 is a generally elongate flexible circuit including connector end portion 44, arm portion 46, suspension mount 48 and conductive traces 50. Connector portion 44, arm portion 46 and suspension mount 48 are integrally formed as a single electrical component which has a length extending from head 28 at the end of suspension 24, along suspension 24 and along support art 22 and actuator arm 20 to control circuit 16 (illustrated in FIG. 1). Connector portion 44, arm portion 46 and suspension mount 48 are formed from a flexible dielectric material such as a polyimide or a polyester such as polyethylene-terephthalate (PET) upon which conductive traces 50 are formed. Upon assembly, connector portion 44 is attached and electrically connected to control circuit 16. Arm portion 46 of electrical interconnect 18 is routed from control circuit 16 down a slot in actuator arm 20 and support arm 22. Suspension mount 48 of electrical interconnect 18 is attached to suspension 24 and is preferably thin to provide low gimbal stiffness of suspension 24. Suspension mount 48 of electrical interconnect 18 widens from arm portion 46 to substantially cover a top surface of suspension 24 projecting from support arm 22. Suspension mount 48 is preferably adhesively bonded to a top surface of suspension 24. Alternatively, suspension mount 48 may be bonded to a lower surface of suspension 24. Suspension mount 48 of electrical interconnect 18 is preferably attached to suspension 24 by viscoelastic adhesive which dampens suspension resonance. Alternatively, rigid adhesives such as epoxies or cyanoacrylates may be used to secure suspension mount 48 to suspension 24. To reduce pitch and roll stiffness of suspension 24, the adhesive is preferably applied between suspension mount 48 and suspension 24 only in selected necessary areas. Because suspension mount 48 is preferably adhesively bonded to suspension 24, suspension mount 48 dampens suspension resonance by absorbing energy from the spring-like material forming suspension 24. As a result, suspension mount 48 dampens amplitude of vibration of suspension 24.

Conductive traces 50 comprise layers of electrically conductive material, such as copper or aluminum, which are fabricated or deposited upon the dielectric material forming connector portion 44, arm portion 46 and suspension mount 48. Conductive traces 50 extend from connector portion 44 along arm portion 46 and across suspension mount 48. Each of conductive traces 50 have ends configured for being electrically coupled to magnetic head 28 and control circuitry 16. Conductive traces 50 are preferably directly connected to magnetic head 28 and control circuitry 16. Alternatively, other electrical connections may be made between conductive traces 50 and either or both of magnetic head 28 and control circuitry 16.

At gimbal portion 26 of suspension 24, conductive traces 50 split apart from one another across torsion arms 51 to minimize stiffness and distribute force symmetrically to suspension 24. Portions of conductive traces 50 are preferably widened where stiffness is not critical to lower the resistance of electrical interconnect 18 for improved electrical performance of control circuit 16. Conductive traces 50 are also preferably in an overlapping relationship to one another so as to lower inductance of electrical interconnect 18 for improved electrical performance of the read/write circuitry in control circuit 16. Conductive traces 50 terminate at end 52 of suspension mount 48 in the form of flying leads 54. Flying leads 54 are bent over end 52 of suspension mount 48 and over gimbal portion 26 of suspension 24 to electrically connect conductive traces 50 to contact pads 42 of magnetic head 28.

Electrical interconnect 18 offers several advantages over conventional electrical interconnects. Because conductive traces 50 completely extend from contact pads 42 to control circuitry 16 as part of a single flexible circuit, only two electrical interconnections are required for each conductive trace 50: a first connection between flying leads 54 and contact pads 42 and a second electrical connection between connector portion 44 and control circuit 16. As a result, magnetic head assembly 10 has greater reliability due to fewer electrical connections or joints otherwise capable of failure. Electrical interconnect 18 is also more robust and less prone to handling damage. In addition, flex circuit 42 has less pitch and roll stiffness than conventional twisted wire bundles. Furthermore, because portions of conductive traces 50 may be widened in regions where stiffness is not critical, the overall electrical resistance of flexible circuit forming electrical interconnect 18 is less than typical 48-gauge wire. Lastly, flexible circuit 42 forming electrical interconnect 18 enables magnetic head assembly 10 to be more easily assembled and automated. Electrical interconnect 18 is more easily attached to contact pads 42 of magnetic head 28 and is more easily routed down the suspension and arms to control circuit 16. Flying leads 52 are simply aligned to contact pads 42 on magnetic head 28 and preferably ultrasonically bonded to contact pads 42. This process may be automated through the use of gang bonding of flying leads 52 in one stroke.

Figure 3:
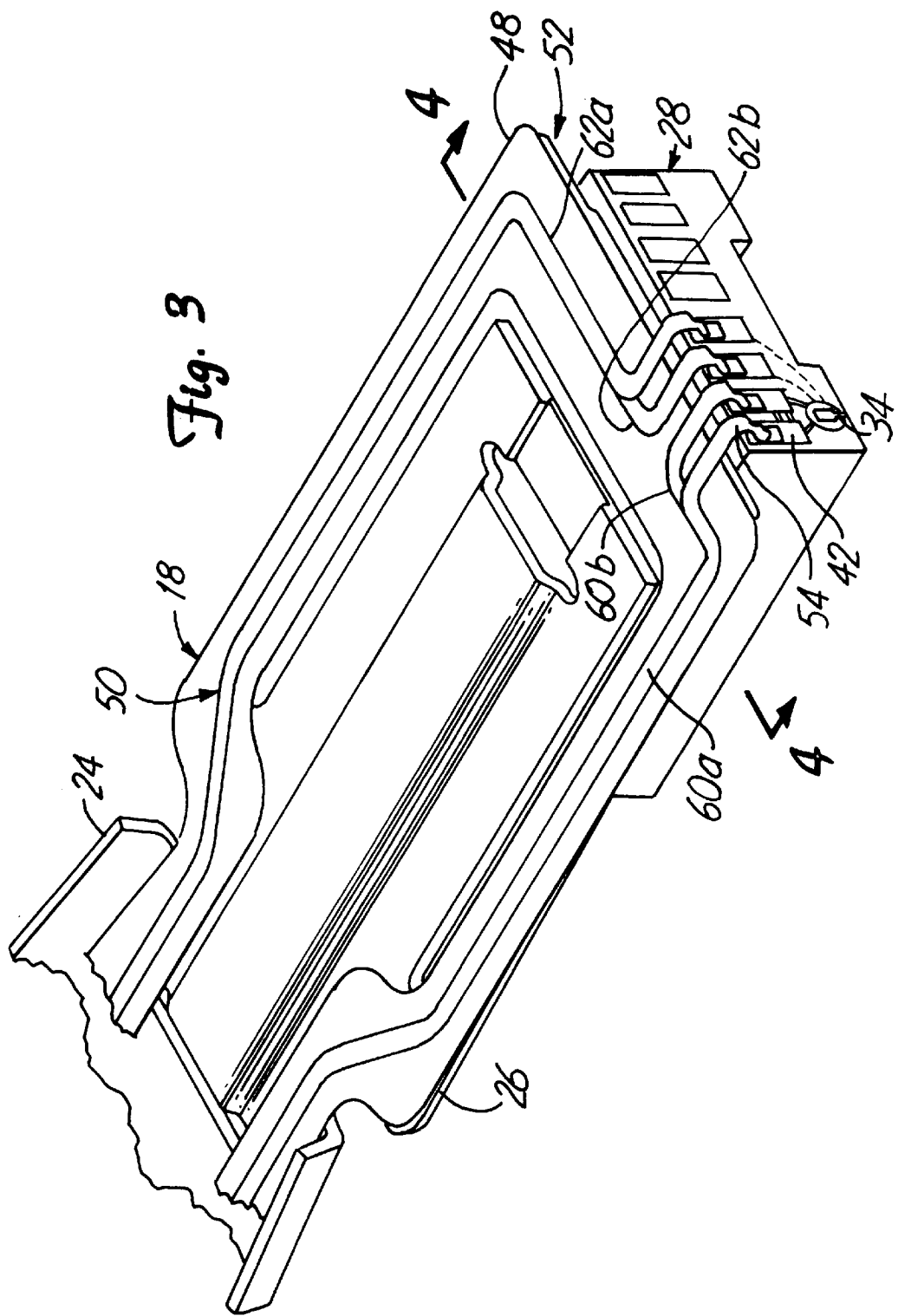
FIG. 3 is an enlarged fragmentary perspective view of the suspension, magnetic head and electrical interconnect.

FIG. 3 is a greatly enlarged fragmentary perspective view of suspension 24, magnetic head 28 and electrical interconnect 18 illustrating flying leads 54 of conductive traces 50 bonded to contact pads 42 of magnetic head 28. As shown by FIG. 3, conductive traces 50 preferably comprise pairs of overlapping conductive lines 60a, 60b and 62a, 62b. Conductive lines 60a and 60b overlap one another along a substantial portion of suspension mount 48. Similarly, conductive lines 62a and 62b overlap one another along a substantial portion of suspension mount 48. Conductive lines 60a and 60b and 62a and 62b are spaced apart by a thin layer of dielectric material The layer of dielectric material has a thickness selected so that conductive lines 60a and 60b and conductive lines 62a and 62b are sufficiently proximate to one another to reduce the combined inductance of conductive lines 60a and 60b, and conductive lines 62a and 62b, respectively. Lines 60a and 60b and lines 62a and 62 separate or split apart from one another towards end 52 suspension 24. Towards end 52 of suspension 24, lines 60a, 60b, 62a, 62b project from suspension 24 and suspension mount 48 to form flying leads 54 which are electrically connected to contact pads 42.

Figure 4:
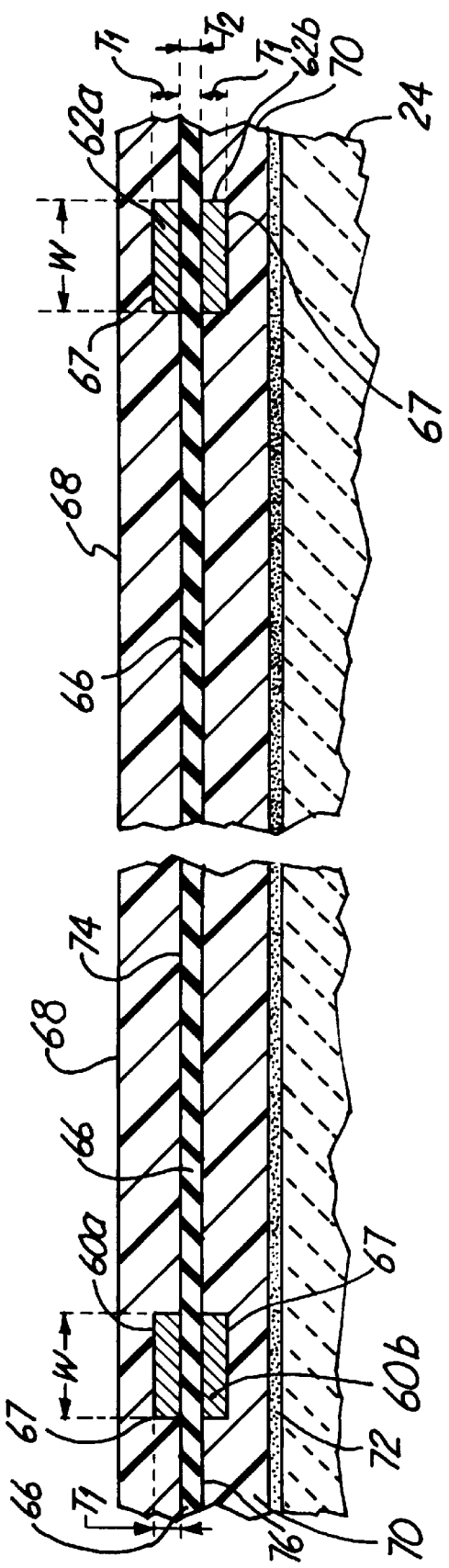
FIG. 4 is a cross-sectional view of the suspension and electrical interconnect.

FIG. 4 is a fragmentary cross-sectional view taken along lines 4—4 of FIG. 3 illustrating conductive lines 60a, 60b and conductive lines 62a, 62b and suspension mount 48 of electrical interconnect 18 in greater detail. As best shown by FIG. 4, conductive lines 60a and 60b and conductive lines 62a and 62b comprise generally flat layers of conductive material having a width W, a thickness $T_1$ and an axial length extending from flying leads 54 and connector portion 44 (shown in FIG. 2). The width W of each conductive line 60, 62 is preferably greater than its thickness T. As a result, conductive lines 60a and 60b and conductive lines 62a and 62b each have a surface area substantially greater than a height or thickness to provide each of lines 60a, 60b, 62a, 62b with a relatively large aspect ratio. As can be appreciated, the thicknesses T, and the widths W of conductive lines 60a, 60b, 62a, 62b may vary with respect to one another and may also vary along the axial length of each conductive line.

With respect to one another, conductive lines 60a and 60b and conductive lines 62a and 62b have relatively large overlapping widths W and surface areas that are electrically separated by a thin dielectric film or layer 66. Dielectric layer 66 preferably has a thickness $T_2$ of less than or equal about 0.001 inches (or about 0.0254 mm). Nominally, dielectric layer 66 has a thickness $T_2$ of about 0.0005 inches (or about 0.0127 mm). Because conductive lines 60a and 60b and conductive lines 62a and 62b have relatively large widths W and surface areas opposing or facing one another in an overlapping relationship and because the surface areas of conductive lines 60a and 60b and conductive lines 62a and 62b are proximate one another, preferably less than or equal to about 0.001 inches (or about 0.0254 mm), the inductance of conductive lines 60a, 60b, 62a and 62b is reduced to improve electrical performance of electrical interconnect 18. Although the relative spacing and configuration of conductive lines 60a and 60b and 62a and 62b increases the capacitance of electrical interconnect 18, it has been discovered that the improved electrical performance achieved by reducing the inductance of electrical interconnect 18 outweighs any disadvantages associated with the increased capacitance of electrical interconnect 18.

Electrical interconnect 18 is preferably formed by a subtraction process. Initially, a thin layer of dielectric material 66 such as a polymer is coated or laminated with layers of a conductive material such as copper on both an upper surface 74 and a lower surface 76 of layer 66. To pattern conductive lines 60a, 60b, 62a and 62b, both layers 67 of conductive material are selectively patterned by an etching process to produce conductive lines 60a, 60b, 62a and 62b. As shown in FIGS. 3 and 4, conductive lines 60a and 60b are preferably patterned so as to substantially overlay and overlap one another along a substantial portion of their width and length. Once conductive lines 60a, 60b and 62a, 62b are patterned upon dielectric layer 66, dielectric coatings or layers 68 and 70 are deposited over conductive lines 60a, 60b and 62a, 62b to protect and electrically insulate the conductive lines. Layers 68 and 70 may be additionally cover coated or plated with a noble metal such as gold to prevent copper corrosion and migration. Once formed, flexible circuit 42 is adhesively secured to suspension 24 by adhesive 72.

Alternatively, electrical interconnect 18 may be formed with an additive process wherein a dielectric material is first coated or adhesively bonded upon a surface of suspension 24 to form dielectric layer 70. Conductive lines 60b and 62b are formed by sputtering an electrically conductive material, such as copper, onto layer 70 in a selected pattern using well-known masking techniques. Next, layer 66 of dielectric material is coated or applied over layer 70 and over conductive lines 60b and 62b. Conductive material such as copper is then once again sputtered over layer 66 in a patterned fashion so as to at least partially overlap conductive lines 60b and 62b along a substantial portion of its width and length to form conductive lines 60a and 62a. Finally, dielectric layer 68 of a dielectric material is coated or applied over conductive lines 60a and 62a to insulate and protect conductive lines 60a and 62a. As can be appreciated, layers 68 and 70 may be omitted where it is desirable to expose portions of conductive lines 60a, 60b, 62a and 62b for electrical connections.

FIG. 5 is a greatly enlarged fragmentary perspective view of electrical interconnect 218, an alternate embodiment of electrical interconnect 18, coupled to suspension 224 for electrically interconnecting magnetic head 28 to read/write circuitry 16 (shown in FIG. 1). For ease of illustration, those elements of electrical interconnect 218 and suspension 224 which are similar to corresponding elements of interconnect 18 and suspension 24 are numbered similarly. Suspension 224 is similar to suspension 24 except that suspension 224 includes a gimbal portion 226 which defines a window 227 extending through suspension 224 for permitting electrical interconnect 218 to be electrically connected to contact or bond pads 242 located upon a top surface of slider 32.

Electrical interconnect 218 is substantially identical to electrical interconnect 18 except that electrical interconnect 218 includes flying leads 254 which extend from an end of suspension mount 48 and electrically connect to top bond pads 242. As with electrical interconnect 18, electrical interconnect 218 includes conductive lines 60a and 60b and conductive lines 62a and 62b which overlap one another along a substantial portion of suspension mount 48. Towards end 52 of suspension mount 48, conductive lines 60a and 60b and conductive lines 62a and 62b separate into horizontally spaced apart lines to form flying leads 254 which are electrically connected to contact pads 242. Contact pads 242 are fabricated upon a surface of slider 32 and are electrically connected to transducer 34. As a result, electrical interconnect 218 electrically connects transducer 34 and read/write circuitry 16 (shown in FIG. 1).

Although the present invention has been described with reference to preferred embodiments, workers skilled in the art will recognize that changes may be made in form and detail without departing from the spirit and scope of the invention.

What is claimed is:

1. A magnetic head assembly for a disc drive, the assembly comprising:
   a magnetic transducer;
   a slider supporting the magnetic transducer;
   a flexible suspension supporting the slider;
   an arm supporting the flexible suspension;
   a circuit board; and
   an electrical interconnect electrically connecting the magnetic transducer and the circuit board, the interconnect including:
      a dielectric substrate;
      a first elongated conductive trace layer formed upon the substrate, the first conductive trace layer having a first end electrically coupled to the magnetic head and a second end electrically coupled to the circuit board, the first conductive trace having a length between its ends on the substrate and having a width;

a dielectric layer formed upon at least a portion of the first conductive trace layer; and a second conductive trace layer formed upon the dielectric layer opposite the first conductive trace layer, the second conductive trace layer having a first end electrically coupled to the magnetic head and a second end electrically coupled to the read/write circuitry, the second conductive trace having a length between its ends on the substrate and having a width, wherein the second conductive trace layer at least partially overlaps the first conductive trace layer to sandwich at least a portion of the dielectric layer between the first and second conductive trace layers along a substantial portion of the lengths of both the first and second conductive trace layers and wherein the first and second conductive trace layers are sufficiently proximate one another to minimze inductance of the interconnect.

2. The magnetic head assembly of claim 1 wherein the dielectric substrate of the electrical interconnect is flexible.

3. The magnetic head assembly of claim 1 wherein the dielectric substrate extends over the flexible suspension.

4. The magnetic head assembly of claim 1 wherein the dielectric substrate is adhesively bonded to the flexible suspension.

5. The magnetic head assembly of claim 1 wherein the electrical interconnect includes bared termination leads electrically connected to the first and second conductive trace layers and extending from the dielectric substrate for electrically connecting the first and second conductive trace layers to the magnetic transducer.

6. The magnetic head assembly of claim 1 wherein the magnetic head includes top bond pads and wherein the termination leads are electrically connected to the top bond pads.

7. The magnetic head assembly of claim 1 wherein the magnetic head includes end bond pads and wherein the termination leads are electrically connected to the end bond pads.

8. The magnetic head assembly of claim 1 wherein the dielectric substrate and the first and second conductive trace layers have a first end adjacent the magnetic head and a second end adjacent the read/write circuitry.

* * * * *

UNITED STATES PATENT AND TRADEMARK OFFICE
CERTIFICATE OF CORRECTION

PATENT NO. : 5,883,759
DATED : MARCH 16, 1999
INVENTOR(S) : KEVIN J. SCHULZ

It is certified that error appears in the above-identified patent and that said Letters Patent is hereby corrected as shown below:

Col. 1, line 31, delete "modem", insert --modern--

Col. 1, line 44, delete "partally", insert --partially--

Col. 5, line 19, delete "T", insert --$T_1$--

Signed and Sealed this

Twenty-second Day of May, 2001

Attest:

NICHOLAS P. GODICI

*Attesting Officer*   *Acting Director of the United States Patent and Trademark Office*